United States Patent
Giannatto et al.

[19]

[11] Patent Number: 5,835,349
[45] Date of Patent: Nov. 10, 1998

[54] PRINTED CIRCUIT BOARD-MOUNTED, SEALED HEAT EXCHANGER

[75] Inventors: Carl J. Giannatto, Melbourne; Kevin C. Cornish; Walter H. Straub, both of Palm Bay, all of Fla.

[73] Assignee: Harris Corporation, Melbourne, Fla.

[21] Appl. No.: 873,677

[22] Filed: Jun. 12, 1997

[51] Int. Cl.⁶ ........................................... H05K 7/20
[52] U.S. Cl. .................. 361/701; 165/80.3; 165/104.33; 361/719
[58] Field of Search ..................... 165/80.3, 122, 165/185, 80.4, 104.33, 139, 149, 80.5; 257/706, 707, 712, 713, 722; 62/259.2; 174/16.1, 16.3; 361/692–695, 796, 831, 701–704, 707–711, 715–719, 720–722, 699

[56] References Cited

U.S. PATENT DOCUMENTS

| | | | |
|---|---|---|---|
| 4,006,388 | 2/1977 | Bartholo | 361/696 |
| 4,009,423 | 2/1977 | Wilson | 361/385 |
| 4,807,441 | 2/1989 | Agee | 62/3 |
| 4,958,257 | 9/1990 | Wenke | 361/385 |
| 5,079,619 | 1/1992 | Davidson | 357/81 |
| 5,183,104 | 2/1993 | Novothy | 165/104.33 |
| 5,276,584 | 1/1994 | Collins et al. | 361/718 |
| 5,412,536 | 5/1995 | Anderson et al. | 361/700 |
| 5,414,592 | 5/1995 | Stout et al.. | 361/704 |
| 5,424,916 | 6/1995 | Martin | 361/698 |
| 5,440,450 | 8/1995 | Lau et al. | 361/695 |
| 5,457,342 | 10/1995 | Herbst, II | 257/712 |
| 5,461,878 | 10/1995 | Moore | 62/255 |
| 5,467,250 | 11/1995 | Howard et al. | 361/696 |
| 5,467,251 | 11/1995 | Katchmar | 361/719 |
| 5,473,508 | 12/1995 | Porter et al. | 361/695 |
| 5,473,511 | 12/1995 | Reddy et al. | 361/719 |
| 5,535,094 | 7/1996 | Nelson et al. | 361/697 |

*Primary Examiner*—Gerald P. Tolin
*Attorney, Agent, or Firm*—Charles E. Wands

[57] ABSTRACT

A housing structure for retaining and cooling a plurality of printed circuit boards includes an arrangement of parallel electrical connectors, which receive associated connectors mounted to respective ones of the printed circuit boards. Integrated with each printed circuit board is a respective frame-configured thermally conductive heat exchanger, that abuts a first side of the printed circuit board. A second side of the printed circuit board contains circuit components to be cooled. Cooling fluid flowing through the adjacent chambers of the heat exchanger draws heat away from the circuit components. A cooling fluid supply and removal plenum is coupled to adjacent fluid inlet and exhaust ports provided at a top end wall of the heat exchanger. Mounting the printed circuit components on the side of the printed circuit board opposite to that to which the heat exchanger is affixed isolates the circuit components from the heat exchanger and thereby prevents the circuit components from being exposed to any potentially corrosive foreign matter that may be present in the cooling fluid flowing through the heat exchanger. In addition, affixing the heat exchanger directly to the printed circuit board increases the flexure stiffness of the circuit board structure.

7 Claims, 3 Drawing Sheets

5,835,349

PRINTED CIRCUIT BOARD-MOUNTED, SEALED HEAT EXCHANGER

FIELD OF THE INVENTION

The present invention relates in general to a housing and cooling assembly for a plurality of communication signal processing circuit boards. In particular, the cooling assembly of the present invention employs a plurality of heat exchangers, respective ones of which are mounted to individual printed circuit boards, and have cooling fluid (e.g., air) flow paths thereof sealed with a cooling fluid supply/exhaust plenum mounted to the housing chassis, in such a manner as to isolate the circuit components of the circuit boards from the cooling fluid flowing through the heat exchangers, thereby preventing the circuit components from being exposed to any potentially corrosive foreign matter in the cooling fluid.

BACKGROUND OF THE INVENTION

A variety of communication systems, particularly those installed in mobile platforms, are designed to be environmentally robust in terms of their hardware and signaling format. As a non-limiting example, for the case of an airborne communication system intended for use with a plurality of UHF line-of-sight and satellite links, a multi-link transceiver mounting rack may contain a plurality of diverse pieces of communication equipment, that typically include RF transmitter modules, RF receiver modules, and various digital signal processing modules, which control the operation of the RF components, and interface digital communications signals with attendant encryption and decryption processing circuits. Since each communication link has its own dedicated signaling scheme (modulation format, link protocol, band occupancy assignment, etc.), suppliers of such equipment will typically provide each system as an integrated unit.

One of the standard bus architectures employed for such systems is the VME bus. The VME bus architecture is comprised of a pair of multiple lead bus links, one of which has a predefined set of bus connection definitions, to which each module that may be plugged into the VME bus must conform, and a second of which, except for limited power rail assignments, has unspecified bus connection definitions, so that the user is free to customize the second bus link or connector interconnects to that bus link as desired.

Typically, RF signaling circuits and digital signaling modules plug into their own connector slots on the VME bus, in order to provide noise/cross-talk isolation between the RF and digital signal processing components of a given communication system architecture, and to conform with the relatively tight (center-to-center) dimensional spacings between connector slots on the VME bus. Signal connections between modules may be effected by cabling links between the modules and/or use one or more pins of module connectors for the second bus link portion of the VME bus, connection definitions for which would otherwise be unspecified for user customization.

Because VME-based communication system platforms can be expected to be employed in relatively harsh environments that expose the platforms to vibration, foreign matter and potentially damaging temperature variations, VME bus specifications mandate ruggedized housing architectures, that also cool the circuit components and effectively seal them from the external ambient. To accomplish these objectives it has been conventional practice to use very complex (and expensive) chassis-integrated heat transfer structures, on the one hand, and to use more thermally robust circuit components, per se, which undesirably add substantial bulk (and cost) to each circuit board, and thus to the overall housing assembly.

SUMMARY OF THE INVENTION

In accordance with the present invention, the shortcomings of conventional (VME) bus-mounted communication signal processing module configurations, described above, are effectively obviated by a new and improved housing and cooling assembly that reduces the very substantial heat resistance paths typically encountered in such systems to a thermal parameter window that allows the use of commercial grade circuit components. As will be described, the invention not only significantly reduces the cost of the system, but provides a housing architecture that is reduced in size relative to that of a conventional thermally controlled VME bus-based communication system architecture, and thereby facilitates installation of a VME bus-based signal processing system configuration in a relatively limited volume hardware platform, such as a high performance aircraft.

Pursuant to the present invention, a respective heat exchanger is affixed to each individual printed circuit board, so as to impart structural rigidity to the circuit board and also effectively physically isolate (seal) the board's circuit components from the cooling fluid flow path to and from a cooling fluid supply/exhaust plenum mounted to a housing chassis. As a result, not only is the flexure stiffness of the circuit board increased, but the circuit components of the circuit boards are not subjected to any potentially corrosive foreign matter that may be present in the cooling fluid.

Such an 'on-board' heat exchanger architecture is readily plugged into one of a plurality of parallel electrical connectors of a VME bus-type chassis. A plurality of circuit components are mounted to a first side of the printed circuit board, while a conductive plate surface of a frame-configured thermally conductive heat exchanger is affixed to a second side of the board. Internal of the heat exchanger is a cooling fluid flow path that extends between a cooling fluid inlet port and an adjacent cooling fluid exit port. Each of these ports is located in a plane that is parallel to the printed circuit board, so as to limit the effective thickness of the integrated heat exchanger—printed circuit board architecture to a sufficiently narrow dimension that allows the printed circuit board to be readily inserted into any of the support connectors of the chassis.

In particular, the present invention employs a housing enclosure having a chassis that is configured to securely retain and a plurality of printed circuit boards in parallel, spatially aligned relationship. The chassis has parallel sidewalls and adjoining parallel end walls that define a multi-board insertion cavity therebetween. Sidewalls of the multi-board insertion cavity contain guide slots that are sized to receive and guide rails mounted to side edges of the printed circuit boards, and thereby facilitate insertion of VME bus connectors along bottom edges of the circuit boards into an arrangement of parallel, multi-pin electrical connectors supported by a bottom plate of the housing.

A first side of a respective printed circuit board is attached to a lightweight, frame-configured thermally conductive heat exchanger, so as to form an integrated circuit board - heat exchanger card structure. In effect, the heat exchanger frame imparts structural rigidity to the printed circuit board, on the one hand, and also is operative to draw heat away from and thereby cool circuit components mounted to a second side of the printed circuit board. Because the entirety of the first side of the printed circuit board is directly coupled in face-to-face abutment with a thermally conductive cover of that board's heat exchanger, the length of the thermal resistance path between any circuit component and the heat exchanger is extremely short, resulting in the lowest possible component temperatures for any given material set and cooling fluid conditions.

What results is a relatively evenly cooled printed circuit board that does not require mil-spec components; instead, commercial circuit elements, which are considerably less costly, may be used. Also, through a multi-slotted cooling fluid supply and exhaust plenum mounted to the top of the chassis, each printed circuit board's heat exchanger is coupled to a common source of cooling fluid, so that the average temperature of the cooling fluid for each printed circuit board is substantially the same.

Each frame-configured, thermally conductive heat exchanger has a first cooling fluid flow chamber, that contains a corrugated, fin-shaped thermally conductive heat exchange element, over which a cooling fluid supplied to a fluid inlet port of an end wall of the heat exchanger frame passes. A second cooling fluid flow chamber is in fluid communication with the first cooling fluid flow chamber, and also contains a corrugated, fin-shaped, thermally conductive heat exchange element, through which the cooling fluid exiting the first cooling fluid flow chamber passes. The second cooling fluid flow chamber has a cooling fluid exhaust port in the frame end wall adjacent to the cooling fluid inlet port.

Providing the fluid inlet and exhaust ports of the circuit board-mounted heat exchanger on the same (top) side of the heat exchanger frame facilitates installation of a relatively compact cooling fluid transport hardware configuration in the VME bus housing, and is thus consistent with the objective of making the housing readily installable in a relatively limited volume hardware platform, such as a high performance aircraft.

The heat exchanger frame has a center divider wall that extends from the top wall to a location spaced apart from a bottom wall, so as to provide an intra-chamber fluid communication port connecting the first and second cooling fluid flow chambers. A heat exchange cover plate is sized to conform with the printed circuit board. The first and second thermally conductive, corrugated heat exchange elements are sized to substantially fill the first and second fluid flow chambers, but leave a fluid circulation region that provides a fluid flow loop path for cooling fluid that has entered the first chamber via the cooling fluid inlet port and has traveled over the first heat exchange element. Upon exiting the first heat exchange element, the cooling fluid travels through the fluid circulation region and over second heat exchange element in the second chamber, and exits the second chamber through the cooling fluid exhaust port in the top wall of the heat exchanger frame.

As pointed out above, the cooling fluid supply/exhaust plenum is mounted to the top of the chassis. The plenum includes a cooling fluid supply chamber and a cooling fluid removal chamber that are in fluid communication with the first and second chambers of the heat exchanger frame of a respective printed circuit board. The cooling fluid supply/exhaust plenum has a first set of slots that are arranged to adjoin fluid inlet ports of heat exchangers of respective printed circuit boards, and a second set of slots arranged to adjoin fluid exhaust ports of heat exchangers of the respective printed circuit boards that are retained in associated guide slots of the chassis.

A multi-slotted gasket is inserted between the end walls of the heat exchanger frames and the floor of the cooling fluid supply/exhaust plenum, to provide a sealing interface between the first and second slots of the supply/exhaust plenum and the fluid inlet and exhaust ports of heat exchangers of the respective printed circuit boards.

DETAILED DESCRIPTION

Figure 1:
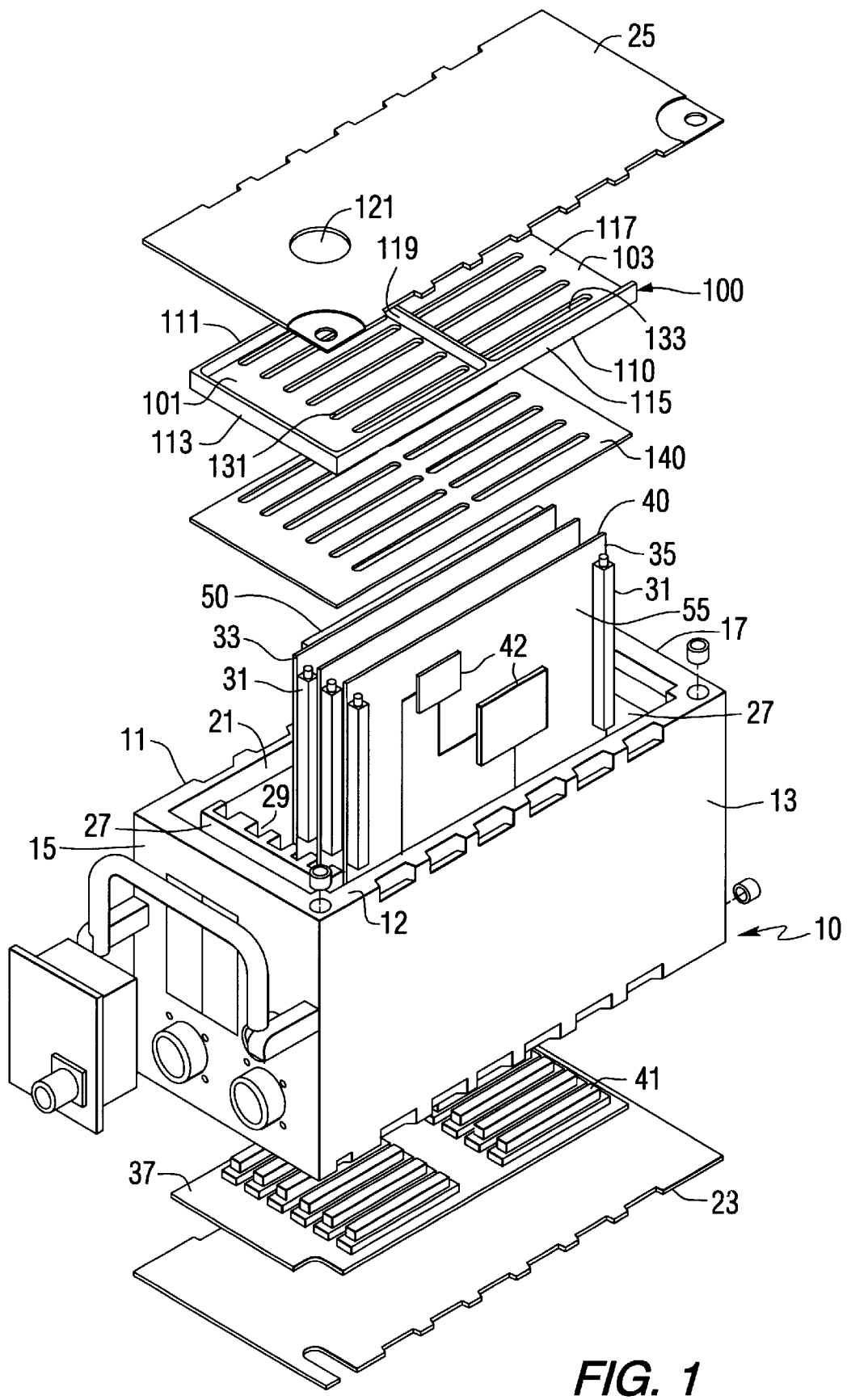
FIG. 1 is an exploded perspective view of a housing structure in accordance with the present invention.

FIGS. 1–5 diagrammatically illustrate a housing structure of the present invention, which is configured to securely retain and cool a plurality of printed circuit boards in parallel, spatially aligned relationship. As shown therein, the housing structure is comprised of a generally regular rectangular, six-sided, ruggedized metallic chassis 10 having first and second parallel sidewalls 11 and 13. These sidewalls adjoin first and second parallel end walls 15 and 17, that are generally orthogonal to the chassis sidewalls, and defining a generally rectangular card-insertion cavity 21 therebetween. The bottom of the chassis 10 is closed by a bottom cover 23, while the top of the chassis is closed by a top cover 25.

The card insertion cavity 21 is bounded by a pair of slotted frames 27, each of which contains a plurality of generally vertical, card-guide slots 29, that are sized to receive sets of guide rails or posts 31 that are mounted to opposite side edges 33 and 35 of respective printed circuit boards 40. Mounted at the bottom of the slotted frames 27 is a connector retention plate 37, upon which an arrangement of parallel, multi-pin electrical connectors 41 is affixed. The multi-pin connectors 41 of the plate 37 are configured to receive associated multiple in-line multi-pin connectors 43, which are attached to bottom edges 45 of respective ones of the printed circuit boards 40, so that the printed circuit boards 40, when installed in the chassis 10, may be vertically inserted into and retained in mutually adjacent, spatially parallel relationship with one another.

Figure 2:
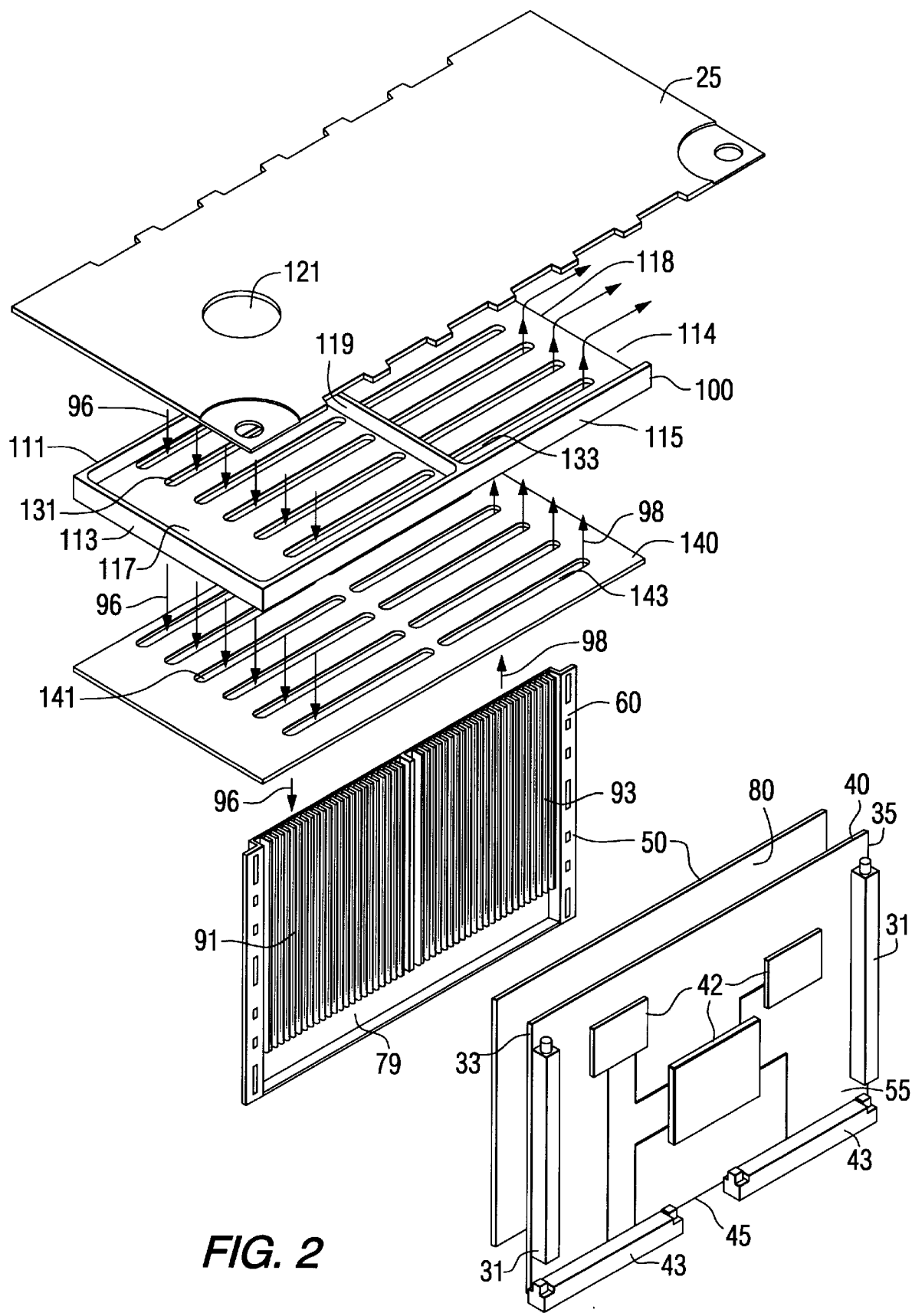
FIG. 2 is an exploded perspective view showing details of components of the housing structure of FIG. 1.
Figure 3:
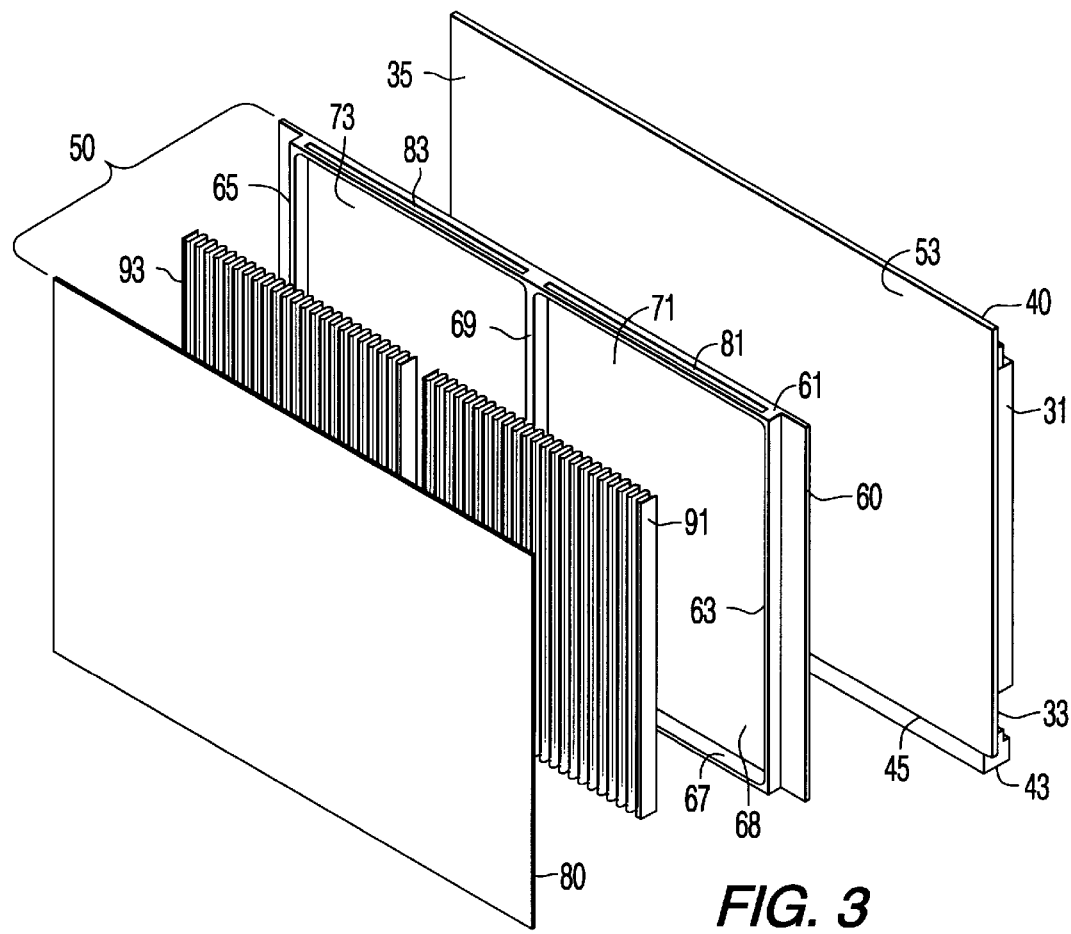
FIG. 3 is a reverse exploded perspective view of a printed circuit board and heat exchanger of FIGS. 1 and 2.
Figure 4:
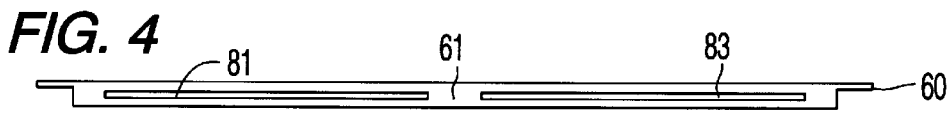
FIG. 4 is a top view of a heat exchanger frame.
Figure 5:
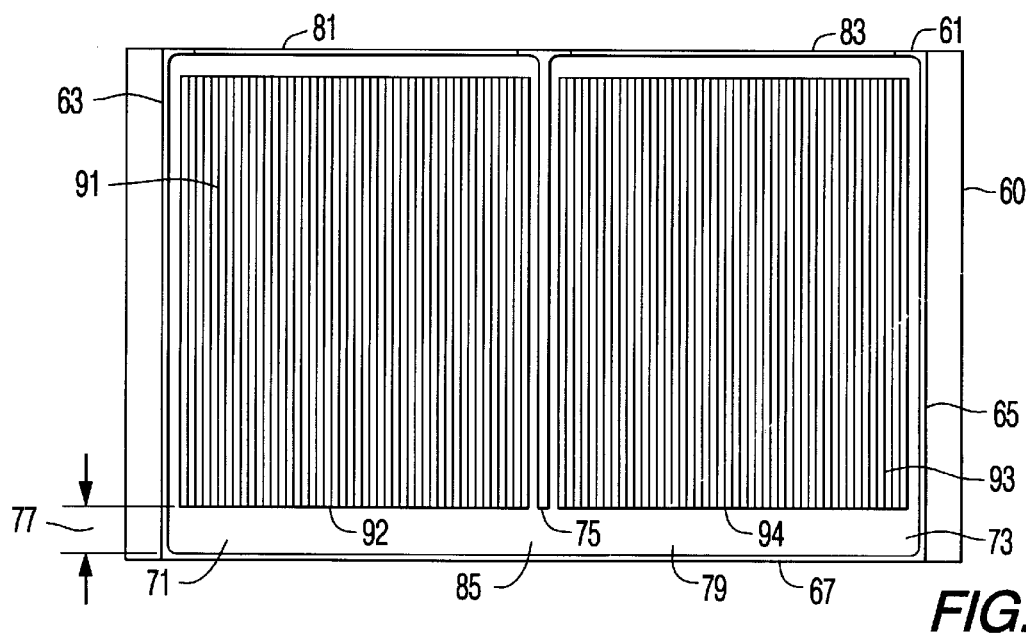
FIG. 5 is a front view of a heat exchanger frame, showing heat exchanger elements installed in cooling chambers of the frame.

As shown in greater detail in the exploded views of FIGS. 2 and 3, a first side 53 of each printed circuit board 40 is attached to a generally frame-configured, thermally conductive (e.g., metallic), convection-based heat exchanger 50, which is operative to draw heat away from and thereby cool circuit components supported by the printed circuit board 40, as will be described. A second side 55 of the printed circuit board 40 contains circuit components 42 to be cooled. Mounting the printed circuit components on the second side 55 of the printed circuit board 40 opposite to the first side 53 to which the heat exchanger 50 is attached serves to isolate the circuit components from the heat exchanger and thereby prevent the circuit components 42 from being exposed to any potentially corrosive foreign matter that may be present in the cooling fluid, such as air as a non-limiting example. In addition, as described previously, affixing the heat exchanger 50 directly to the printed circuit board 40 results in an increased flexure stiffness, 'integrated' heat exchanger circuit—board structure.

The generally rectangular frame 60 of the thermally conductive heat exchanger 50 has a top wall 61, side walls 63 and 65, a bottom wall 67, and a back wall 68 that generally enclose a pair of adjacent, generally rectangular cooling fluid flow chambers 71 and 73, which are respectively coupled to cooling fluid inlet and exhaust ports 81 and 83, that are formed within top wall 61 of the heat exchanger. Frame 60 also has a center wall 69 that extends from the top wall 61 to a location 75 that is spaced apart from the bottom wall 67 by a distance 77, so as to provide an intra chamber fluid communication port 85 connecting chambers 71 and 73. A heat exchange cover plate 80 serves as a front wall for the frame 60, completing the enclosure of fluid flow chambers 71 and 73. Frame 60 and heat exchanger cover plate 80 are sized to conform with the printed circuit board 40, so that when cover plate 80 is surface-jointed with the first side 53 of the printed circuit board 40, the entirety of the area of the printed circuit board 40 (upon which circuit components 42 are mounted) is coupled to the heat exchanger 50.

This direct face-to-face coupling between the heat exchanger 50 and the printed circuit board 40 serves to minimize thermal resistance between the circuit components 42 to be cooled and the cooling medium of the heat exchanger. Namely, since the entirety of the first side 53 of the printed circuit board 40 is directly coupled in face-to-face abutment with a thermally conductive cover plate 80 of that board's heat exchanger, the length of the thermal resistance path between any circuit component 42 and the heat exchanger 50 is extremely short, resulting in the lowest possible component temperatures for any given material set and cooling fluid conditions. As a consequence, the components 42 that are mounted to the second side 55 of printed circuit board 40 need not be mil-spec; instead, commercial circuit elements, which are considerably less costly, may be used.

The heat exchanger 50 further includes first and second thermally conductive, corrugated heat exchange fin-shaped elements 91 and 93 that are retained in chambers 71 and 73. Heat exchange elements are sized to substantially fill chambers 71 and 73, but leaving a fluid circulation region 79 between bottom edges 92 and 94 of elements 91 and 93, respectively, and the bottom wall 67 of frame 60. This fluid circulation region 79 serves as a fluid flow loop or return path for cooling fluid that has entered the chamber 71 via cooling fluid inlet port 81 and has traveled (downwardly, as shown at arrows 96) through heat exchange element 91. Upon exiting the bottom of heat exchange element 91 in chamber 71, the cooling fluid travels through the intra chamber fluid communication port 85 of region 79 and enters the bottom of heat exchange element 93 in chamber 73. The cooling fluid then travels (upwardly as shown by arrows 98) through heat exchange element 93 and exits through cooling fluid exhaust port 83 in the top wall 61 of frame 60. Since each of ports 81 and 83 is located in a plane that is parallel to the printed circuit board 40, the effective thickness of the integrated heat exchanger—printed circuit board architecture is limited to a sufficiently narrow dimension that allows the printed circuit board to be readily inserted into any of the connectors 41 of the chassis 10.

In order to supply and remove cooling fluid via the ports 81 and 83 of respective cooling fluid chambers 71 and 73, the housing structure of the invention further includes a cooling fluid supply/exhaust plenum 100 mounted to a top portion 12 of the chassis 10. Cooling fluid supply/exhaust plenum 100 includes a cooling fluid supply chamber 101 and a cooling fluid removal chamber 103 that are in fluid communication with the chambers 71 and 73 of each thermally conductive heat exchanger 50 of a respective printed circuit board 40.

For this purpose, cooling fluid supply/exhaust plenum 100 has a generally rectangular frame 110 defined by a first side wall 111, an end wall 113, a second side wall 115, and a bottom wall or floor 117, that generally enclose the pair of adjacent, generally rectangular chambers 101 and 103. Chamber 101, which serves as a cooling fluid supply chamber, has a cooling fluid supply port 121 formed in cover 25 attached to the top edges of the walls of frame 110. Chamber 103, which serves as a cooling fluid removal chamber, has a cooling fluid removal port defined by a plenum opening 114 along a side portion 118 of the frame 110 coincident with an opening in chassis 10.

Frame 110 also has a center wall 119 that extends from the first side wall 111 to the second side wall 115, so as to isolate the chambers 101 and 103 from each other. Within the chamber 101, the bottom wall or floor 117 of the cooling fluid supply/exhaust plenum 100 has a first set of generally elongated slots 131, that are arranged to be coincident with and adjoin the fluid inlet ports 81 of respective heat exchangers 50 of printed circuit boards 40, when the printed circuit boards are retained in their associated guide slots 29 of the chassis' slotted frames 27. The floor portion of the chamber 103 also has a second set of generally elongated slots 133, that are arranged to be coincident with and adjoin the fluid exhaust ports 83 of the respective heat exchangers 50 of printed circuit boards 40, when the printed circuit boards are retained in the guide slots of the chassis' slotted frames.

As noted earlier, the multi-slotted cooling fluid supply and exhaust plenum 100 that is mounted to the top of the chassis provides a common source of cooling fluid for each heat exchanger, so that the average temperature of the cooling fluid for each printed circuit board is substantially the same. Also, mounting the fluid inlet and exhaust ports 81 and 83, respectively, of the heat exchanger on the same (top) wall side of the heat exchanger frame facilitates installation of a relatively compact cooling fluid transport hardware configuration in the VME bus housing, and is thus consistent with the objective of making the housing readily installable in a relatively limited volume hardware platform, such as a high performance aircraft.

In order to seal the cooling fluid interfaces between slots 131 and 133 of supply/exhaust plenum 100 and the fluid inlet and exhaust ports 81 and 83 of heat exchangers 50, a multi-slotted gasket 140 is inserted between the floor 117 of the cooling fluid supply/exhaust plenum 100 and the top walls 61 of the heat exchanger frames 60. Gasket 140 has sets of generally elongated slots 141 and 143, are arranged to be coincident with and adjoin the elongated slots 131 and 133 of plenum 110, and thereby the fluid inlet and exhaust ports 81 and 83 of the respective heat exchangers 50. What results is a heat exchanger structure the cooling fluid pathway through which integrally thermally coupled with the printed circuit board, yet is sealed off from the components 42 mounted on the printed circuit board 40, so that any potential contaminants, which might be present in the cooling fluid, such as ambient air drawn in from the outside of the chassis, cannot come in contact with the printed circuit board. This ensures maximum effective cooling of the components of the printed circuit board, while at the same time protecting the printed circuit components in a sealed chassis.

As will be appreciated from the foregoing description, the shortcomings of conventional (VME) bus-mounted communication signal processing module configurations, described above, are effectively obviated by the housing and cooling assembly of the present invention, which uses an integrated cooling fluid heat exchanger—printed circuit board configuration that shortens the lengths of heat resistance paths typically encountered in VME bus systems, so as to allow the use of commercial grade circuit components. Moreover, the on-board heat exchanger configuration of the invention not only significantly reduces the cost of the system in which it is used, but provides a housing architecture that is reduced in size relative to that of a conventional thermally controlled VME bus-based communication system architecture, and thereby facilitates installation of a VME bus-based signal processing system configuration in a relatively limited volume hardware platform, such as a high performance aircraft.

While we have shown and described an embodiment in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed:

1. A housing enclosure for securely retaining and cooling a plurality of printed circuit boards in parallel, spatially aligned relationship comprising:

a chassis having a card-insertion cavity between parallel sidewalls thereof containing a plurality of card-guide slots, that receive and guide side edges of said printed circuit boards for insertion into an arrangement of electrical connectors at a first portion of said chassis, so that said printed circuit boards are retained in mutually adjacent, spatially parallel relationship with one another;

a cooling fluid supply/exhaust plenum at a second portion of said chassis spaced apart from said first portion of said chassis by said card-insertion cavity therebetween, and including a cooling fluid supply chamber, to which cooling fluid for cooling circuit components of said printed circuit boards is supplied, said cooling fluid supply chamber having a plurality of cooling fluid supply apertures, and a cooling fluid exhaust chamber adjacent to said cooling fluid supply chamber and from which said cooling fluid having cooled said circuit components of said printed circuit boards is removed, said cooling fluid exhaust chamber having a plurality of cooling fluid removal apertures adjacent to said plurality of cooling fluid supply apertures; and a plurality of thermally conductive heat exchangers, a respective thermally conductive heat exchanger of said plurality of thermally conductive heat exchangers being attached to and in thermally conductive engagement with a first side of a respective printed circuit board of said plurality of circuit boards, so as to draw heat away from and thereby cool said circuit components mounted to a second side of said respective printed circuit board, and wherein said respective thermally conductive heat exchanger includes a cooling fluid inlet port joined in sealing engagement with a respective cooling fluid supply aperture of said plurality of cooling supply apertures of said cooling fluid supply chamber of said cooling fluid supply/exhaust plenum, and through which said cooling fluid is introduced from said cooling fluid supply/exhaust plenum, and a cooling fluid outlet port adjacent to said cooling fluid inlet port and joined in sealing engagement with a respective cooling fluid removal aperture of said plurality of cooling fluid removal apertures of said cooling fluid exhaust chamber of said cooling fluid supply/exhaust plenum, and through which said cooling fluid is exhausted from said heat exchanger into said cooling fluid supply/exhaust plenum.

2. A housing enclosure according to claim 1, wherein said respective thermally conductive heat exchanger further includes:

a frame having a first end wall adjoining said fluid supply/exhaust plenum and containing said cooling fluid inlet port and said cooling fluid outlet port, side walls parallel with side edges of said printed circuit cards, a second end wall opposite to said first end wall, and a back wall, that enclose first and second adjacent cooling fluid flow chambers, and a further wall that extends from said first end wall to a location spaced apart from said second end wall, so as to provide an intra chamber fluid communication port connecting said first and second cooling fluid flow chambers, and a heat exchanger cover plate, and wherein said heat exchanger further includes first and second thermally conductive heat exchange elements, respectively retained in and substantially filling said first and second cooling fluid flow chambers, but leaving a fluid circulation region therein that provides a fluid flow loop path for cooling fluid that has entered said first chamber via said cooling fluid inlet port in said first end wall of said frame, and has traveled through said first heat exchange element and, upon exiting said first heat exchange element, travels through said fluid circulation region and said second heat exchange element in said second chamber, exiting through said cooling fluid exhaust port in said first end wall of said frame.

3. A housing enclosure according to claim 1, further including gasket material that seals interfaces between said cooling fluid supply and removal apertures of said supply/exhaust plenum and said fluid inlet and exhaust ports, respectively, of said plurality of thermally conductive heat exchangers.

4. A housing enclosure according to claim 3, wherein said gasket material comprises a multi-apertured gasket inserted between said supply/exhaust plenum and said first end wall of said heat exchanger.

5. A housing enclosure for securely retaining and cooling a plurality of printed circuit boards in parallel, spatially aligned relationship comprising a chassis having parallel sidewalls adjoining parallel end walls that define a card-insertion cavity therebetween, said card insertion cavity having a plurality of card-guide slots that receive and guide side edges of said printed circuit boards for insertion into an arrangement of parallel, multi-pin electrical connectors of a first portion of said chassis, so that said printed circuit boards may be inserted into and retained in mutually adjacent, spatially parallel relationship with one another, and wherein a first side of a respective printed circuit board of said plurality of circuit boards is attached to a thermally conductive heat exchanger, which is configured to draw heat away from and thereby cool circuit components mounted to a second side of said respective printed circuit board, and wherein said thermally conductive heat exchanger has a first enclosed cooling fluid flow chamber containing thermally conductive heat exchange elements through which a cooling fluid supplied to a fluid inlet port of said heat exchanger passes, and a second enclosed cooling fluid flow chamber in fluid communication with said first enclosed cooling fluid flow chamber, and containing thermally conductive heat exchange elements through which said cooling fluid exiting said first enclosed cooling fluid flow chamber passes, said second enclosed cooling fluid flow chamber having a cooling fluid exhaust port adjacent to said cooling fluid inlet port, and wherein said thermally conductive heat exchanger includes a frame having has a first end wall, side walls parallel with side edges of said printed circuit cards, a second end wall opposite to said first end wall, and a back wall, that enclose first and second adjacent cooling fluid flow chambers, which are respectively coupled to cooling fluid inlet and exhaust ports formed within said first end wall, and wherein said frame has a further wall that extends from said first end wall to a location spaced apart from said second end wall, so as to provide an intra chamber fluid communication port connecting said first and second cooling fluid flow chambers, and a heat exchange cover plate, and wherein said heat exchanger further includes first and second thermally conductive heat exchange elements, respectively retained in said first and second cooling fluid flow chambers, and substantially filling said chambers, but leaving a fluid circulation region therein that provides a fluid flow loop path for cooling fluid that has entered said first chamber via said cooling fluid inlet port in said first end wall of said frame, and has traveled through said first heat exchange element and, upon exiting said first heat exchange element, travels through said fluid circulation region and said second heat exchange element in said second chamber, exiting through said cooling fluid exhaust port in said first end wall of said frame, and further including a cooling fluid supply/exhaust plenum mounted to said chassis, said cooling fluid supply/exhaust plenum including a cooling fluid supply chamber and a cooling fluid removal chamber that are in fluid communication with the first and second adjacent cooling fluid flow chambers of the thermally conductive heat exchanger of each of said printed circuit boards, and wherein said cooling fluid supply chamber of said cooling fluid supply/exhaust plenum has a set of cooling fluid supply apertures that are joined in sealing engagement with fluid inlet ports of heat exchangers of said printed circuit boards, and a set of cooling fluid removal apertures that are joined in sealing engagement with fluid exhaust ports of said heat exchangers of said printed circuit boards retained in associated card-guide slots of said plurality of card-guide slots of said chassis.

6. A housing enclosure according to claim 5, further including gasket material sealing interfaces between said apertures of said supply/exhaust plenum and fluid inlet and exhaust ports of heat exchangers of said printed circuit boards.

7. A housing enclosure according to claim 6, wherein said gasket material comprises a multi-apertured gasket inserted between said supply/exhaust plenum and said first end wall of said heat exchanger.

\* \* \* \* \*